United States Patent [19]

Takashima et al.

[11] Patent Number: 5,039,824
[45] Date of Patent: Aug. 13, 1991

[54] PRINTED CIRCUIT HAVING TWISTED CONDUCTOR LINES PRINTED THEREON

[75] Inventors: Tokuhei Takashima, Tokyo; Rihei Takashima, Shiojiri, both of Japan

[73] Assignee: Graphico Co., Ltd., Tokyo, Japan

[21] Appl. No.: 525,065

[22] Filed: May 18, 1990

[30] Foreign Application Priority Data

May 30, 1989 [JP] Japan ................................ 1-136749

[51] Int. Cl.⁵ ........................ H05K 7/06; H05K 1/00; H01B 11/02
[52] U.S. Cl. ..................................... 174/33; 174/262; 333/12
[58] Field of Search ............... 174/32, 33, 34, 117 FF, 174/261, 262, 266, 268; 333/1, 99 R, 4, 5, 12; 361/414, 397, 409, 410

[56] References Cited

U.S. PATENT DOCUMENTS 3,757,028  9/1973  Schlessel .................. 174/33

FOREIGN PATENT DOCUMENTS 3045236  7/1982  Fed. Rep. of Germany ...... 174/262

Primary Examiner—Laramie E. Askin

[57] ABSTRACT

A printed conductor including two twisted conductor lines each have a plurality of segments disposed alternately on opposite surfaces of a circuit board, the successive segments of each line being connected by electrically conductive elements passing through throughholes in the circuit board. The use of such printed conductor improves the transmission characteristics of the printed circuit in the high-frequency range.

3 Claims, 2 Drawing Sheets

PRINTED CIRCUIT HAVING TWISTED CONDUCTOR LINES PRINTED THEREON

BACKGROUND OF THE INVENTION

1. Field of the invention

The present invention relates to a printed circuit, and more particularly to twisted connecting conductor lines between parts in a printed circuit.

2. Description of the prior art

When a signal is transmitted to a subsequent stage from a high-frequency signal source such as a highspeed CPU, undesired electrostatic or magnetic induction on printed conductor lines in a printed circuit will increase with the increase of the length of such printed conductor lines, and such elongated printed conductor lines are liable to pick up noise signals from the exterior or radiate noise signals to the exterior. In the case where two parts which are to be connected cannot be put close to each other, a coaxial cable or an insulated conductor may be preferably used in place of printed conductor lines.

However, such an exterior cable or conductor is large, compared with printed conductor lines, and therefore, the use of such an exterior cable or conductor will prevent reduction of printed circuit size. Also, disadvantageously, the number of the parts to make up a printed circuit increases, and extra-complicated connecting work is required.

A conventional printed circuit has a conductive grounding layer attached to the surface of its dielectric circuit board opposite to the surface bearing a printed circuit pattern. A conventional multi-layer printed circuit has conductive grounding layers each sandwiched between upper and lower circuit pattern laminations, thereby providing a shielding effect. This sort of shielding structure is, in fact, impractical because a substantial transmission loss will be caused by an increased stray capacity appearing between the grounding conductive layer and the signal path pattern. When a circuit pattern is partly curved in an attempt to permit the signal path to extend around a selected circuit part on the printed circuit, the inductance of the curved path will increase, deteriorating the high-frequency transmission characteristics accordingly.

SUMMARY OF THE INVENTION

One object of the present invention is to provide a printed conductor which can improve the transmission characteristics of conductor lines connecting adjacent parts in a printed circuit without recourse to coaxial cables.

Another object of the present invention is to provide a printed conductor which is free of transmission loss which would be caused by a shielding conductor layer attached to the surface of the circuit board opposite to the circuit pattern.

The present invention is based on the fact that two insulated conductor lines are twisted, and the twisted conductor lines are used in transmitting a signal in one and the other directions, that is, allowing the signal to go back and forth in these twisted conductor lines. Then, the resulting magnetic fields around the twisted conductor lines will be opposite to each other cancel each other, thus eliminating magnetic field radiation to the surrounding environment. Also, advantageously, exterior noise signals can have little or no influence on signal current which flows in the twisted conductor lines. The present invention provides twisted conductor lines printed on a circuit board. The twisted conductor lines are appropriate for use in transmitting signals a super-high speed CPU.

To attain these objects of the present invention, a printed conductor according to the present invention comprises two twisted conductor lines each consisting of a plurality of segments disposed alternately on opposite surfaces of a circuit board, the successive segments of each line being connected by electrically conductive means passing through through-holes in the circuit board. With this arrangement the conductor segment pattern printed on the upper surface of the dielectric board is connected to the conductor segment pattern printed on the lower surface of the dielectric board through the through-holes to make up twisted conductor lines. One conductor of the twisted conductor lines may be used to permit signal current to go forward whereas the other conductor line may be used to permit signal current to go back or may be used as grounding conductor. The twisting of two conductor lines has the effect of reducing the capacitance appearing between these two conductor lines and cancelling the resulting magnetic fields around these two conductor lines. Also, little or no electrostatic of magnetic induction will be caused on the twisted conductor lines, and therefore, the twisted conductor lines printed on the dielectric board will be substantially insensitive to exterior noise signals. Undesired radiation will not be caused from the twisted conductor lines, either. The use of such twisted conductor lines in a printed circuit will substantially improve the transmission characteristics of the printed circuit in the high-frequency range. In case where one conductor of the twisted conductor lines is used as a grounding conductor, the transmission line cannot be capacitive, causing no loss in transmission of a super-high frequency signal.

The electrically conductive means of each through-hole may comprise electroless plating.

According to one aspect of the present invention each line consists of linear segments disposed in a zig-zag configuration.

According to another aspect of the present invention each line consists of curved segments disposed in a wavy configuration.

According to still another aspect of the present invention a multi-layer printed circuit includes a plurality of printed conductors each comprising two twisted conductor lines each consisting of a plurality of segments disposed alternately on opposite sides of each of a plurality of lamination layers at different levels, the successive segments of each line being connected by electrically conductive means passing through through-holes in the lamination. The printed conductors are laid out of alignment with a vertical registration, thereby reducing electrostatic or magnetic coupling therebetween.

Other objects and advantages of the present invention will be understood from the following description of printed circuits according to preferred embodiments of the present invention, which are shown in the accompanying drawings.

Figure 1:
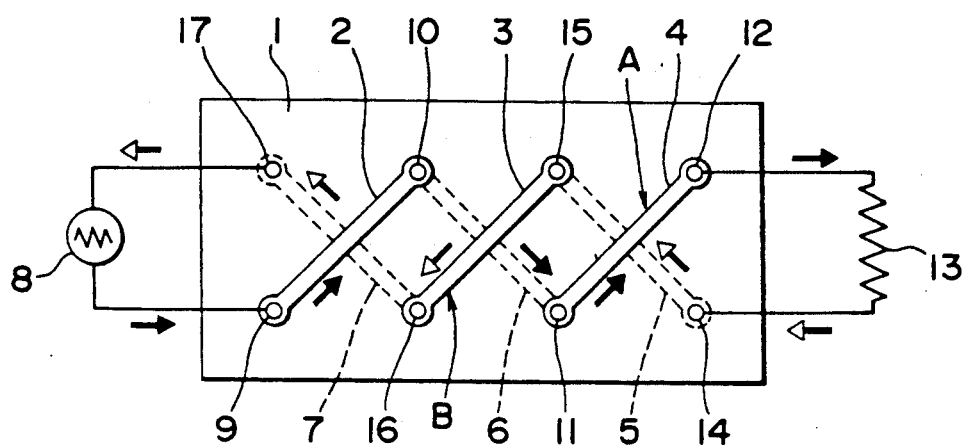
FIG. 1 is a plan view of a printed circuit having conductor segments printed on opposite surfaces of the dielectric board to make up twisted conductor lines according to a first embodiment of the present invention.

Referring to FIG. 1, a printed circuit having two twisted conductor lines printed on its board according to a first embodiment of the present invention is shown. A dielectric board or substrate which is made of phenol resin or epoxy resin is indicated at 1. Discrete conductor segments are indicated at 2, 3 and 4. These conductor segments are printed on one surface of dielectric board 1 according to an etching method, thus making up an upper signal path pattern. Likewise, discrete conductor segments 5, 6 and 7 are printed on the other surface of dielectric board 1, making up a lower signal path pattern. The upper and lower conductor patterns cross at the center of each segment. The opposite enlarged ends of each conductor segment have apertures, and these apertures are electroless plated inside to connect to through-holes 9-12 and 14-17 electroless plated inside also. Thus, the upper conductor pattern consisting of segments 2, 3 and 4 is electrically connected to the lower conductor pattern consisting of segments 5, 6 and 7 alternately to provide a twisted conductor consisting of two continuous cross-stitched conductor lines A and B.

As shown in FIG. 1 a super-high frequency signal source 8 such as a CPU may by connected to one end each of the twisted conductor lines A and B, and load 13 may be connected to the other end each of twisted conductor lines A and B.

A signal may be transmitted from signal source 8 at a moment as indicated by arrow, flowing from signal source 8 to load 13 through through-hole 9, conductor segment 2 and through-hole 10 on the upper surface of dielectric board 1; through-hole 10, conductor segment 6 and through-hole 11 on the lower surface of dielectric board 1; and through-hole 11, conductor segment 4 and through-hole 12 on the upper surface of dielectric board 1. Then, signal flows from load 13 to signal source 8 through through-hole 14, conductor segment 5 and through-hole 15 on the lower surface of dielectric board 1; through-hole 15, conductor segment 3 and through-hole 16 on the upper surface of dielectric board 1; and through-hole 16, conductor segment 7 and through-hole 17 on the lower surface of dielectric board 1.

Figure 2:
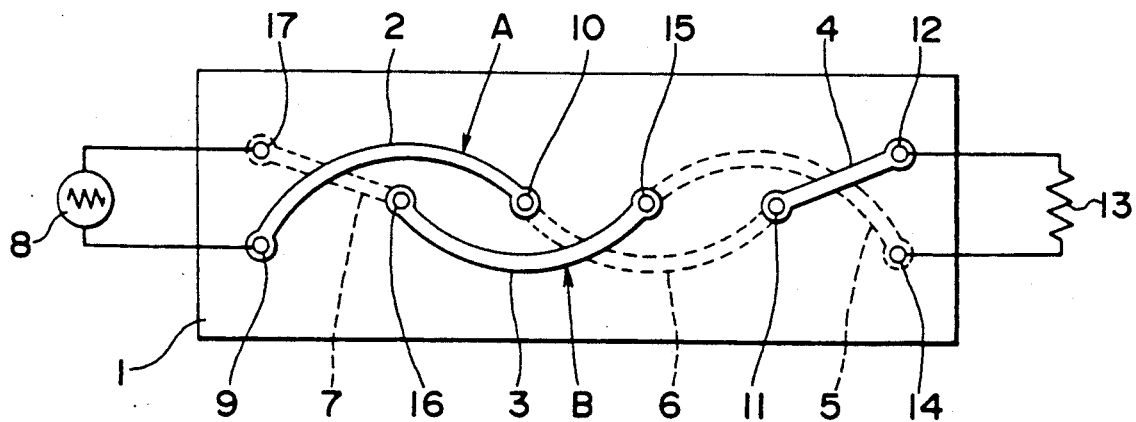
FIG. 2 is a similar plan view of a printed circuit according to a second embodiment of the present invention.

Referring to FIG. 2, a printed circuit having two twisted conductor lines printed on its board according to a second embodiment of the present invention is shown.

As shown, through-holes 10, 11, 15 and 16 are arranged in a single line except two opposite ends 9, 17 and 12, 14. On the upper surface of printed board 1 each curved conductor segment 2 or 3 connects every other through-hole 9, 10 or 16, 15 whereas on the lower surface of the printed board each curved conductor segment 5 or 6 connects every other through-hole 14, 15 or 11, 10. In this particular example signal paths A and B cross to each other at three points, and are twisted one time. Elongated signal paths may cross at four or more points, and may be crossed two or more times.

Figure 3:
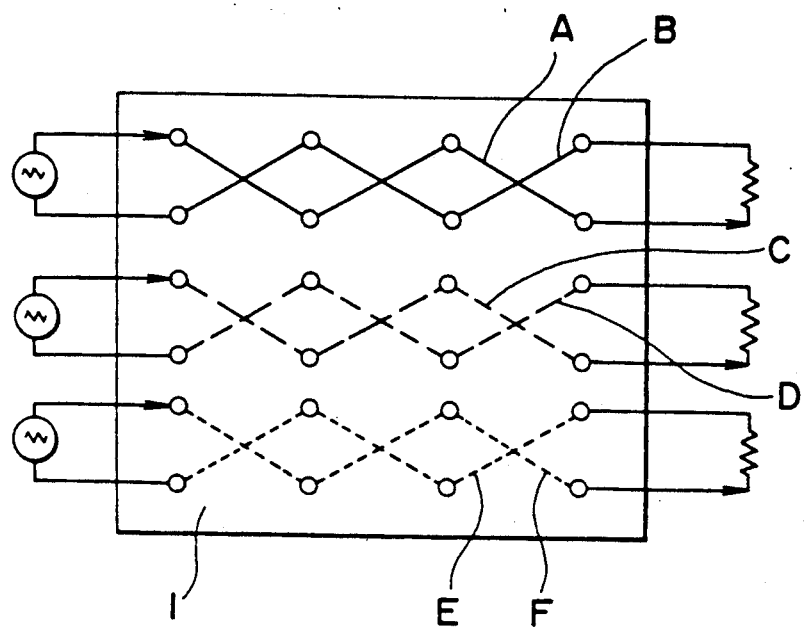
FIG. 3 is a plan view of a printed circuit having a plurality of twisted conductor lines in a multi-layer board according to a third embodiment of the present invention.
Figure 4:
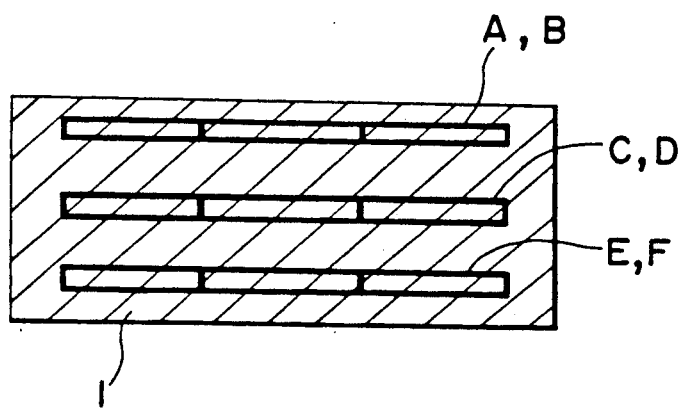
FIG. 4 is a schematic view showing how a plurality of twisted conductor lines ar at different levels in a multi-layer board.

FIGS. 3 and 4 show a multi-layer printed circuit having three twisted conductors of FIG. 1 sandwiched between laminations. Six signal path patterns are laid in six laminations. In FIG. 3, upper conductor lines A and B are shown by a solid line; intermediate conductor lines C and D are shown by a broken line; and lower conductor lines E and F are shown by dots.

These three twisted conductors are not arranged in registration as viewed vertically.

As described earlier, the twisting of two conductor lines has the effect of reducing the stray capacitance appearing between these two conductor lines and cancelling the resulting magnetic fields around these two conductor lines. Also, little or no electrostatic or magnetic induction will be caused on the twisted conductor lines, and therefore, the twisted conductor lines printed on the dielectric board will be substantially insensitive to exterior noise signals. Undesired radiation will not be caused from the twisted conductor lines, either. The use of such twisted conductor lines in a printed circuit will substantially improve the transmission characteristics of the printed circuit in the high-frequency range. In a case where one conductor of the twisted conductor lines is used as a grounding conductor, the transmission line cannot be capacitive, causing no loss in transmission of a super high frequency signal.

What is claimed is:

1. A printed circuit comprising:
   a substrate having first and second ends;
   a plurality of through-holes formed through said substrate in a predetermined pattern between said first and second ends, said plurality of through-holes including a pair of through-holes positioned adjacent each end of said substrate for access to terminals of a signal source and a load respectively, remaining ones of said plurality of through-holes being linearly arranged in a longitudinal direction of said substrate and between said pairs of through-holes; and
   a plurality of conductive segments disposed alternately on opposite surfaces of said substrate and connected by electricity conductive means passing through each of said plurality of through-holes, said plurality of segments including a first straight segment on one side of the substrate connected to one of the pair of through-holes at the first end of the substrate and to the nearest linearly arranged through-hole, and a second straight segment on the opposite side of the substrate connected to the nearest linearly arranged through-hole, and a second straight segment on the opposite side of the substrate connected to one of the pair of through-holes at the second end of the substrate and to the nearest linearly arranged through-hole, the remaining ones of said plurality of conductive segments being of an arcuate shape and connected such that a first s-shaped pattern is obtained between the other of the pair of through-holes at the first end of the substrate and the straight segment at the second end of the substrate, and a second s-shaped pattern is obtained between the other of the pair of through-holes at the second end of the substrate and the straight segment at the first end of the substrate.

2. The printed circuit according to claim 1, wherein opposing ends of each of said plurality of arcuate segments are connected to every other one of said plurality of through-holes.

3. The printed circuit according to claim 1, wherein said electrically conductive means comprises plating in each of said plurality of through-holes.

* * * * *